United States Patent
Jung et al.

(10) Patent No.: US 10,522,216 B2
(45) Date of Patent: Dec. 31, 2019

(54) STATIC RANDOM ACCESS MEMORY INCLUDING ASSIST CIRCUIT

(71) Applicant: INDUSTRY-ACADEMIC COOPERATION FOUNDATION, YONSEI UNIVERSITY, Seoul (KR)

(72) Inventors: Seong Ook Jung, Seoul (KR); Se Hyuk Oh, Seoul (KR); Han Wool Jeong, Seoul (KR); Ju Hyun Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 16/038,414

(22) Filed: Jul. 18, 2018

(65) Prior Publication Data
US 2019/0027213 A1    Jan. 24, 2019

(30) Foreign Application Priority Data

Jul. 18, 2017 (KR) .................. 10-2017-0090981

(51) Int. Cl.
| | | |
|---|---|---|
| *G11C 11/419* | (2006.01) | |
| *G11C 7/12* | (2006.01) | |
| *G11C 8/08* | (2006.01) | |
| *H01L 27/11* | (2006.01) | |

(52) U.S. Cl.
CPC ............ *G11C 11/419* (2013.01); *G11C 8/08* (2013.01); *H01L 27/1104* (2013.01); *G11C 7/12* (2013.01)

(58) Field of Classification Search
CPC .......... G11C 11/419; G11C 8/08; G11C 7/12; H01L 27/1104
See application file for complete search history.

(56) References Cited

U.S. PATENT DOCUMENTS

| | | |
|---|---|---|
| 8,503,221 B1 | 8/2013 | Hobson et al. |
| 2013/0021864 A1* | 1/2013 | Deng ............... G11C 29/50 365/201 |

FOREIGN PATENT DOCUMENTS

| | | |
|---|---|---|
| KR | 10-2012-0008254 A | 1/2012 |
| KR | 10-1420255 B1 | 7/2014 |
| KR | 10-2015-0040986 A | 4/2015 |

(Continued)

OTHER PUBLICATIONS

Communication dated Nov. 17, 2018, issued by Korean Patent Office in counterpart Korean Patent Application No. 10-2017-0090981.

*Primary Examiner* — Tri M Hoang
(74) *Attorney, Agent, or Firm* — Sughrue Mion, PLLC

(57) ABSTRACT

Disclosed is a static random access memory including an assist circuit. More particularly, a static random access memory according to an embodiment of the present disclosure may include a bit cell part including at least one bit cell connected between a first ground voltage node and a second ground voltage node; and a controller including a first transistor configured to control connection between the first ground voltage node and the second ground voltage node, a second transistor configured to float a first ground voltage of the first ground voltage node, and a third transistor configured to float a second ground voltage of the second ground voltage node, wherein the controller controls the first and second ground voltages supplied to the bit cell part using the first, second, and third transistors.

12 Claims, 11 Drawing Sheets

(56) References Cited

FOREIGN PATENT DOCUMENTS

| KR | 10-2015-0128871 A | 11/2015 |
|----|-------------------|---------|
| KR | 10-1727262 B1 | 4/2017 |

* cited by examiner

STATIC RANDOM ACCESS MEMORY INCLUDING ASSIST CIRCUIT

CROSS-REFERENCE TO RELATED APPLICATION

This application claims the priority benefit of Korean Patent Application No. 10-2017-0090981, filed on Jul. 18, 2017 in the Korean Intellectual Property Office, the disclosure of which is incorporated herein by reference.

BACKGROUND OF THE DISCLOSURE

Field of the Disclosure

The present disclosure relates to a static random access memory including an assist circuit, and more particularly, to a static random access memory capable of increasing the efficiency of read and write operations by controlling column-based ground voltage using an assist circuit.

Description of the Related Art

There has arisen a problem in providing a design capable of harmoniously, stably providing read and write operations in 6T SRAM. To address this problem, a method of applying an assist circuit has been proposed.

When a static random access memory cell including an assist circuit performs a write operation using a bit-interleaving structure, power consumption may be high because assist should be applied to all columns when a column-based write assist circuit and a column-based read assist circuit are used in row half-selected bit cells, and power consumption may be high because the number of row-half-selected bit cells is larger than the number of selected bit cells when a row-based write assist circuit is combined with a column-based read assist circuit. Accordingly, an assist circuit configuration including a column-based write assist circuit and a row-based read assist circuit may be appropriate in terms of power consumption.

However, when a write operation is performed using a column-based assist circuit according to a related technology, the cell ground (GNDH) of all selected rows should increase by 150 mV from the ground (GND). In addition, there is additional energy consumption due to the 150 mV higher ground of all cells in all selected columns upon performing the write operation, and costs for energy and area may arise due to use of the selected column cells as an additional voltage source.

Therefore, there is a need for an assist circuit to compensate for the above problems.

RELATED ART DOCUMENTS

Patent Documents (Patent Document 1) Korean Patent Application Publication No. 10-2015-0128871, entitled "Write-assisted Memory Having Improved Speed"

(Patent Document 2) Korean Patent Application Publication No. 10-2015-0040986, entitled "SRAM Read Preferred Bit Cells Having Write Assist Circuit"

(Patent Document 3) Korean Patent Application Registration No. 10-1420255, entitled "SRAM Cell Writability Improvement"

(Patent Document 4) Korean Patent Application Publication No. 10-2012-0008254, entitled "Static Random Access Memory Device Including Assist Circuit"

SUMMARY OF THE DISCLOSURE

Therefore, the present disclosure has been made in view of the above problems, and it is one object of the present disclosure to provide a static random access memory including an assist circuit.

It is another object of the present disclosure to provide a static random access memory capable of increasing the efficiency of read and write operations by controlling a column-based ground voltage using the assist circuit.

It is another object of the present disclosure to provide a static random access memory capable of increasing an integrated ground voltage without additional energy consumption by providing a current from a bit line or bit line bar of an unselected column to an integrated ground voltage, after floating of an integrated ground voltage in a write operation.

It is another object of the present disclosure to provide a static random access memory capable of increasing the possibility of data flip by only increasing a ground voltage of a data node for writing first data among ground voltages of a selected bit cell in a write operation, thereby increasing writing ability increasing the selected bit cell.

It is another object of the present disclosure to provide a static random access memory capable of guaranteeing read stability of a row half-selected bit cell because an integrated ground voltage increases after a bit line or bit line bar of a unselected bit cell is discharged for a predetermined time in a write operation.

It is yet another object of the present disclosure to provide a static random access memory capable of reducing read delay of a bit cell selected from a bit cell part, based on the effect of a ground voltage control assist circuit, by lowering an integrated ground voltage to a negative voltage using a coupling phenomenon before a voltage of a word line is converted to a high level in a read operation.

In accordance with an aspect of the present disclosure, the above and other objects can be accomplished by the provision of a static random access memory including a bit cell part including at least one bit cell connected between a first ground voltage node and a second ground voltage node; and a controller including a first transistor configured to control connection between the first ground voltage node and the second ground voltage node, a second transistor configured to float a first ground voltage of the first ground voltage node, and a third transistor configured to float a second ground voltage of the second ground voltage node, wherein the controller controls the first and second ground voltages supplied to the bit cell part using the first, second, and third transistors.

The static random access memory according to an embodiment of the present disclosure may turn off the first transistor, turn on the second transistor and turn off the third transistor during a write operation for a bit cell selected form the bit cell part to float the second ground voltage of the second ground voltage node.

The static random access memory according to an embodiment of the present disclosure may convert a voltage of a word line connected to the selected bit cell from a low level to a high level after floating the second ground voltage of the second ground voltage node during the write operation for the selected bit cell.

The static random access memory according to an embodiment of the present disclosure may apply a power supply voltage to a first bit line connected to the bit cell part and apply a ground voltage to a second bit line connected to the bit cell part during the write operation for the selected bit cell.

The static random access memory according to an embodiment of the present disclosure may further include a fourth transistor for blocking an integrated ground voltage related to the first and second ground voltages input to the bit cell part.

The static random access memory according to an embodiment of the present disclosure may further include an adjacent bit cell part including at least one adjacent bit cell connected between a third ground voltage node and a fourth ground voltage node.

The static random access memory according to an embodiment of the present disclosure may further include a fifth transistor configured to control connection between the third ground voltage node and the fourth ground voltage node, a sixth transistor configured to float a third ground voltage of the third ground voltage node, and a seventh transistor configured to float a fourth ground voltage of the fourth ground voltage node, and may control the third and fourth ground voltages supplied to the adjacent bit cell part using the fifth, sixth, and seventh transistors.

The static random access memory according to an embodiment of the present disclosure may turn off the fourth transistor to float the integrated ground voltage, after a power supply voltage of a third or fourth bit line connected to the adjacent bit cell part is discharged.

The static random access memory according to an embodiment of the present disclosure may further include a cross coupler including transistors configured to control voltage sharing between the bit cell part and the controller and transistors configured to control voltage sharing between the first bit line and the second bit line.

The static random access memory according to an embodiment of the present disclosure may further include a circuit protector configured to float the integrated ground voltage using inverter chain delay and then float the floated integrated ground voltage to a negative voltage.

The static random access memory according to an embodiment of the present disclosure may turn on the first, second, third, and fifth transistors and turn off the fourth, sixth, and seventh transistors when the circuit protector converts the integrated ground voltage to the negative voltage.

The static random access memory according to an embodiment of the present disclosure may convert a voltage of a word line from a low level to a high level after conversion to the negative voltage to perform a read operation for a bit cell selected from the bit cell part.

In accordance with another aspect of the present invention, there is provided a method of controlling a static random access memory including a bit cell part including at least one bit cell connected between a first ground voltage node and a second ground voltage node; and a controller including a first transistor configured to control connection between the first ground voltage node and the second ground voltage node, a second transistor configured to float a first ground voltage of the first ground voltage node, and a third transistor configured to float a second ground voltage of the second ground voltage node, wherein the controller controls the first and second ground voltages supplied to the bit cell part using the first, second, and third transistors.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
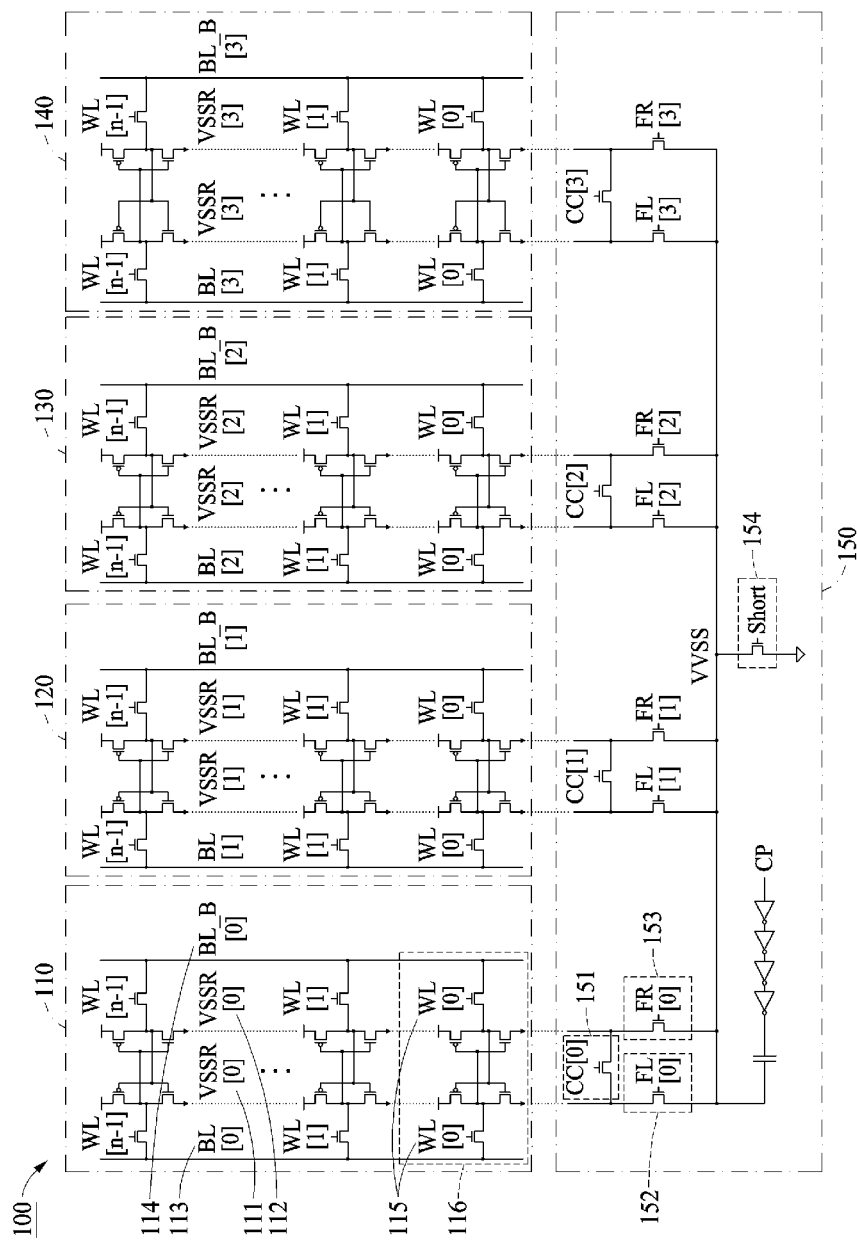
FIG. 1 illustrates a circuit configuration of a static random access memory according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or."

That is, unless otherwise mentioned or clearly inferred from context, the expression "x uses a or b" means any one of natural inclusive permutations.

A static random access memory according to an embodiment of the present disclosure may include a bit cell part and a controller.

A bit cell part according to an embodiment of the present disclosure may include at least one bit cell connected between a first ground voltage node and a second ground voltage node.

In addition, a controller according to an embodiment of the present disclosure may control first and second ground voltages, which are supplied to the bit cell part, using a plurality of transistors.

Although a static random access memory according to an embodiment of the present disclosure is described using four bit cell parts in the following embodiments, the number of bit cell parts may be variously changed. That is, the number of bit cell parts is not limited to four.

FIG. 1 illustrates a circuit configuration of a static random access memory 100 according to an embodiment of the present disclosure.

In particular, FIG. 1 illustrates components of the static random access memory 100 according to an embodiment of the present disclosure. Herein, "part" refers to a unit for processing at least one function or operation and may be implemented by hardware, software, or a combination of hardware and software.

As illustrated in FIG. 1, the static random access memory 100 according to an embodiment of the present disclosure may include a first bit cell part 110, a second bit cell part 120, a third bit cell part 130, a fourth bit cell part 140, and a controller 150.

For example, each of the first, second, third, and fourth bit cell parts 110, 120, 130, and 140 may include the same number of bit cells. The first, second, third, fourth bit cell parts 110, 120, 130, and 140 may share driving voltage of the word lines 115 through bit cells located on the same row line. Here, the respective bit cell parts 110, 120, 130, and 140 may receive driving voltage through the same word line 115 arranged in a row direction.

For example, when the first bit cell part 110 receives driving voltage corresponding to a high level through the word lines 115, the second bit cell part 120 may also receive driving voltage corresponding to a high level through the word lines 115.

Although the first and second bit cell parts 110 and 120 are described as examples for convenience of explanation, the third and fourth bit cell parts 130 and 140 may also operate in the same manner.

That is, when the first bit cell part 110 receives driving voltage corresponding to a high level through the word lines 115, the third and fourth bit cell parts 130 and 140 may also may receive driving voltage corresponding to a high level through the word lines 115 in the same manner as in the second bit cell part 120. Here, the word line 115 may be connected to a gate of a pass gate transistor of a selected bit cell of the first bit cell part 110 and may selectively provide driving voltage, which controls drive of the pass gate transistor, as a low level and a high level. In addition, the word line 115 may be connected to gates of pass gate transistors included in a selected bit cell of the first bit cell part 110 and bit cells of the second, third, and fourth bit cell parts 120, 130, and 140 located on the same row line as the selected bit cell of the first bit cell part 110 to selectively provide driving voltage of the pass gate transistors included in the respective bit cells as a low level and a high level.

That is, the word line 115 may be connected to gates of pass gate transistors included in the respective bit cells to selectively provide driving voltage, which controls drive of the pass gate transistors of the bit cells, as a low level and a high level.

In addition, the static random access memory 100 may include a plurality of bit cell parts, and each of the bit cell parts may include a memory device in which a plurality of bit cells is accumulated and thus data is processed.

For example, the static random access memory 100 may include the first bit cell part 110 connected between a first ground voltage node 111 and a second ground voltage node 112 to which an integrated ground voltage is supplied.

For example, the first bit cell part 110 may be constituted of at least one bit cell. That is, the first bit cell part 110 may include at least one bit cell connected between the first ground voltage node 111 and the second ground voltage node 112. Here, when the number of bit cells increases, the speed related to data processing, data throughput, etc. may increase.

According to an embodiment of the present disclosure, any one bit cell 116 of the first bit cell part 110 may be selected. Here, the selected bit cell 116 may include a selected bit cell of a bit cell part.

For example, when a bit cell of the first bit cell part 110 is selected, the first bit cell part 110 may be a bit cell part and the second, third, and fourth bit cell parts 120, 130, and 140 including an unselected bit cell may be adjacent bit cell parts.

In addition, the static random access memory 100 may perform read and write operations for a selected bit cell.

The first bit cell part 110 according to an embodiment of the present disclosure may be connected to a first bit line 113 and a second bit line 114.

For example, the first bit line 113 may include a bit line, and the second bit line 114 may include a bit line bar. That is, the voltage of the first bit line 113 and the voltage of the second bit line 114 may be mutually incompatible.

For example, when the voltage of the first bit line 113 is a power supply voltage, the voltage of the second bit line 114 may be a ground voltage. Here, the power supply voltage may include a drain voltage and a voltage corresponding to a high level. In addition, the ground voltage may include a source voltage and a voltage corresponding to a low level.

In the static random access memory 100 according to an embodiment of the present disclosure, the first, second, third, and fourth bit cell parts 110, 120, 130, and 140 may be connected to the controller 150. For example, the controller 150 may include an assist circuit.

The controller 150 according to an embodiment of the present disclosure may include a first transistor 151, a second transistor 152, and a third transistor 153.

In accordance with an embodiment of the present disclosure, the first transistor 151 may control connection between the first ground voltage node 111 and the second ground voltage node 112.

For example, when the first transistor 151 receives a driving voltage corresponding to a low level, it may be turned off and may block ground voltage sharing between the first ground voltage node 111 and the second ground voltage node 112.

In addition, the first transistor 151 may include a cell connection control transistor.

The second transistor 152 according to an embodiment of the present disclosure may float a first ground voltage of the first ground voltage node 111.

For example, when the second transistor 152 receives a driving voltage corresponding to a low level, it may be turned off and may block a ground voltage transmitted to the first ground voltage node 111 to float a first ground voltage of the first ground voltage node 111.

In addition, the second transistor 152 may include a first floating transistor.

In accordance with an embodiment of the present disclosure, the third transistor 153 may float a second ground voltage of the second ground voltage node.

For example, when the third transistor 153 receives a driving voltage corresponding to a low level, it may be turned off and may block a ground voltage transmitted to the second ground voltage node 112 to float the first ground voltage of the first ground voltage node 111.

In addition, the third transistor 153 may include a second floating transistor. In addition, the controller 150 may further include a fourth transistor 154.

For example, when the fourth transistor 154 is turned off, it may block an integrated ground voltage transmitted to the first, second, third, and fourth bit cell parts 110, 120, 130, and 140.

In accordance with an embodiment of the present disclosure, the static random access memory 100 may control an integrated ground voltage introduced into a static random access memory through the fourth transistor 154.

In accordance with an embodiment of the present disclosure, the controller 150 may include a cell connection selection transistor and first and second floating transistors for each of the bit cell parts 110, 120, 130, and 140.

In accordance with an embodiment of the present disclosure, when the static random access memory 100 performs a read or write operation for the bit cell 116 selected from the first bit cell part 110, any one bit cell, which is located on the same row line as the selected bit cell 116, among bit cells included in each of the second, third, and fourth bit cell parts 120, 130, and 140 may be a row half-selected bit cell.

For example, when one bit cell is selected from the first bit cell part 110 in the static random access memory 100, a bit cell located on the same row line as a selected bit cell among at least one bit cell included in the second, third, and fourth bit cell parts 120, 130, and 140 and sharing the word lines 115 may be a row half-selected bit cell.

In accordance with an embodiment of the present disclosure, the controller 150 may control the first ground voltage, which is supplied to the first ground voltage node, and the second ground voltage, which is supplied to the second ground voltage node, using the first transistor 151, the second transistor 152 and the third transistor 153.

In accordance with an embodiment of the present disclosure, the second bit cell part 120 may be connected between a third ground voltage node and a fourth ground voltage node to which a ground voltage is supplied.

In accordance with an embodiment of the present disclosure, the controller 150 may further include a fifth transistor controlling connection between the third ground voltage node and the fourth ground voltage node in the second bit cell part 120, a sixth transistor floating a third ground voltage of the third ground voltage node, and a seventh transistor floating a fourth ground voltage of the fourth ground voltage node.

In addition, the controller 150 may control the third and fourth ground voltages supplied to the second bit cell part 120 using the fifth, sixth, and seventh transistors.

Figure 2A:
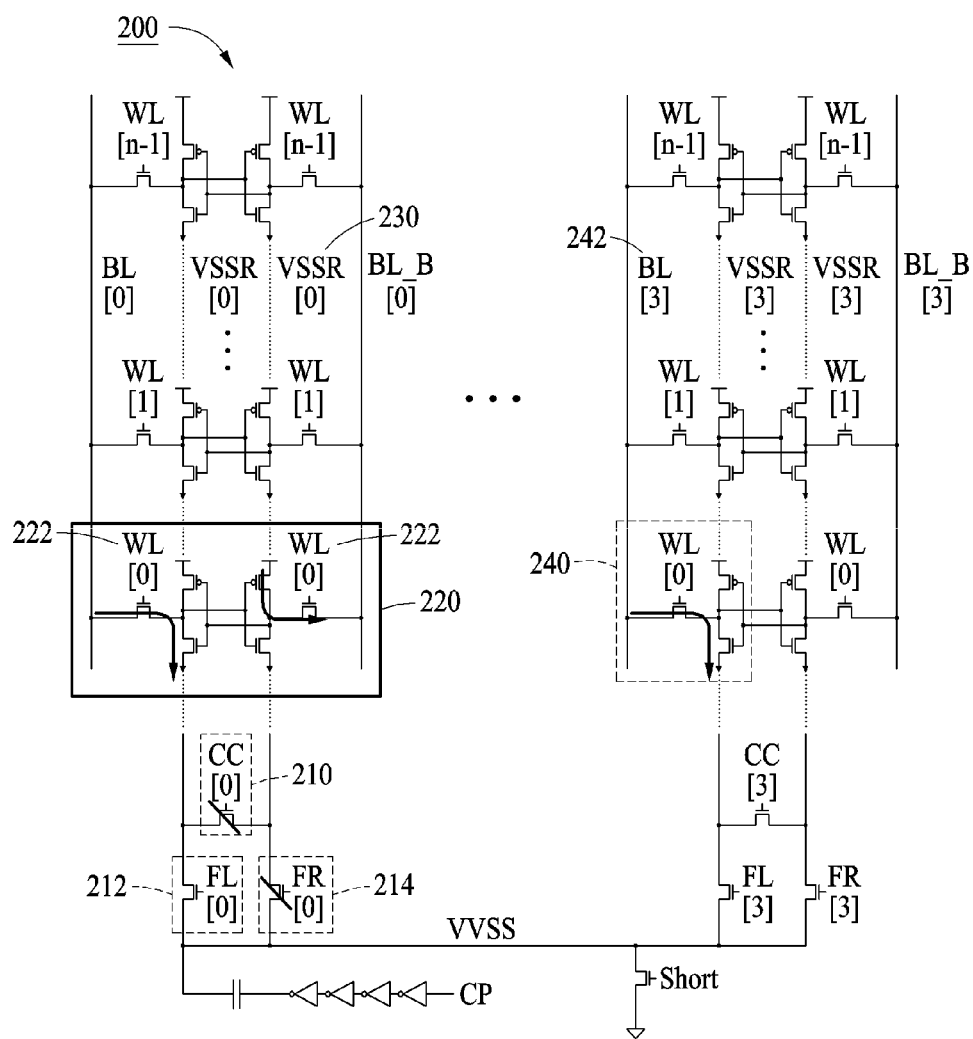
FIGS. 2A and 2B illustrate circuit configurations related to a write operation of a static random access memory according to an embodiment of the present disclosure and graphs therefor.
Figure 2B:
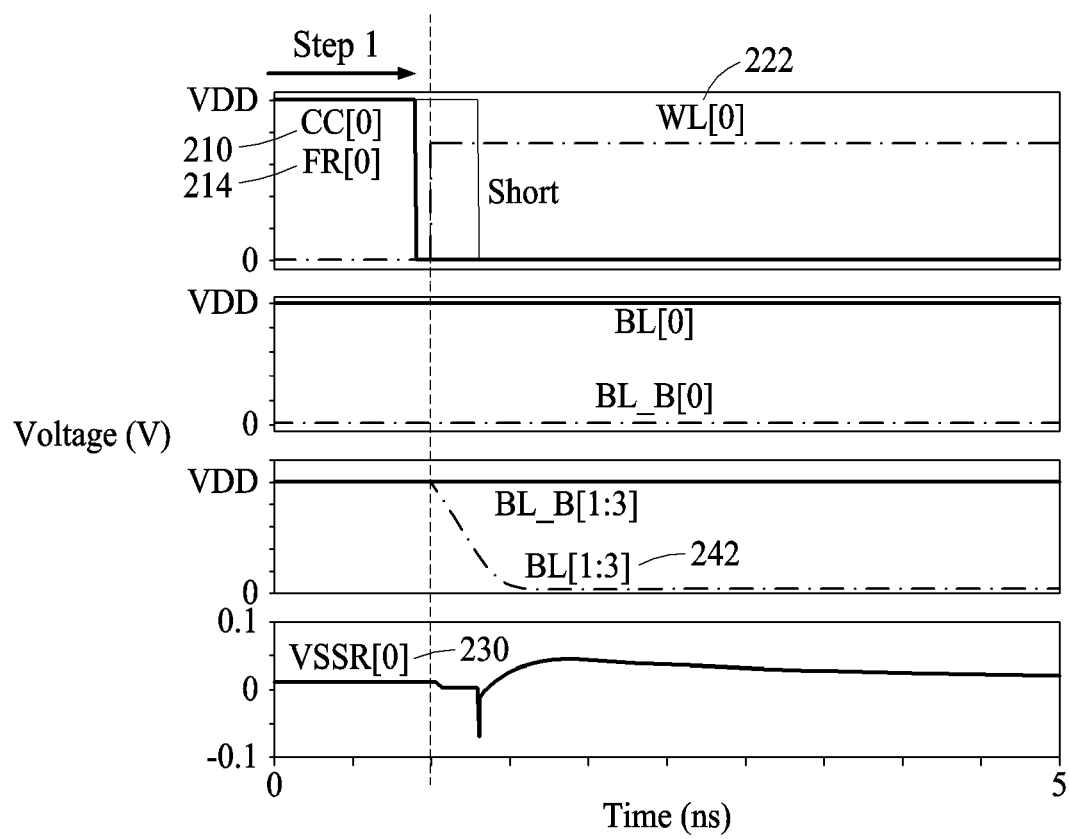

FIGS. 2A and 2B illustrate a circuit configuration related to a write operation of a static random access memory according to an embodiment of the present disclosure and graphs therefor.

In particular, FIGS. 2A and 2B illustrate components related to a first write operation step of the static random access memory according to an embodiment of the present disclosure and graphs therefor.

More particularly, in an operation of writing first data on a left data node of a bit cell selected from a bit cell part, a circuit configuration related to an operation that a controller controls first and third transistors is illustrated. For example, the first data may be read and written when a high voltage corresponding to a voltage higher than a certain reference value is obtained or applied in the static random access memory. For example, second data may be read and written when a low voltage corresponding to a voltage lower than a certain reference value is obtained or applied in the static random access memory.

Referring to FIG. 2A, a controller in a static random access memory 200 changes operation states of the first and third transistors 210 and 214 before converting a driving voltage of a word line 222 connected to a bit cell 220 selected from at least one bit cell part, which is connected between a first ground node and a second ground node, from a low level to a high level.

That is, the controller may turn off the first transistor 210, turn on a second transistor 212, and turn off the third transistor 214 to float a second ground voltage of the second ground voltage node 230 upon a write operation for the bit cell 220 selected from the bit cell part.

In addition, the controller may convert a voltage of the word line 222, which is connected to the selected bit cell 220, from a low level to a high level after floating the second ground voltage of the second ground voltage node 230.

Accordingly, since the static random access memory according to an embodiment of the present disclosure only increases a ground voltage of a data node for writing first data among ground voltages of a bit cell selected from a bit cell part in a write operation, the possibility of data flip may increase, thereby improving writing ability of the bit cell selected from the bit cell part.

FIG. 2B illustrates a voltage change in the circuit operation of FIG. 2A.

Referring to FIG. 2B, in a first step of a write operation, a driving voltage of the first transistor 210 and a driving voltage of the third transistor 214 are converted from a high level to a low level, a voltage of a first bit line connected to the bit cell part is a high level, a voltage of a second bit line connected to the bit cell part is a low level, a driving voltage of a word line connected to the selected bit cell is converted from a low level to a high level, and a voltage of a bit line 242 of an adjacent bit cell part starts to decrease. In addition, in the first step, a second ground voltage of the second ground voltage node 230 is maintained.

Figure 3A:
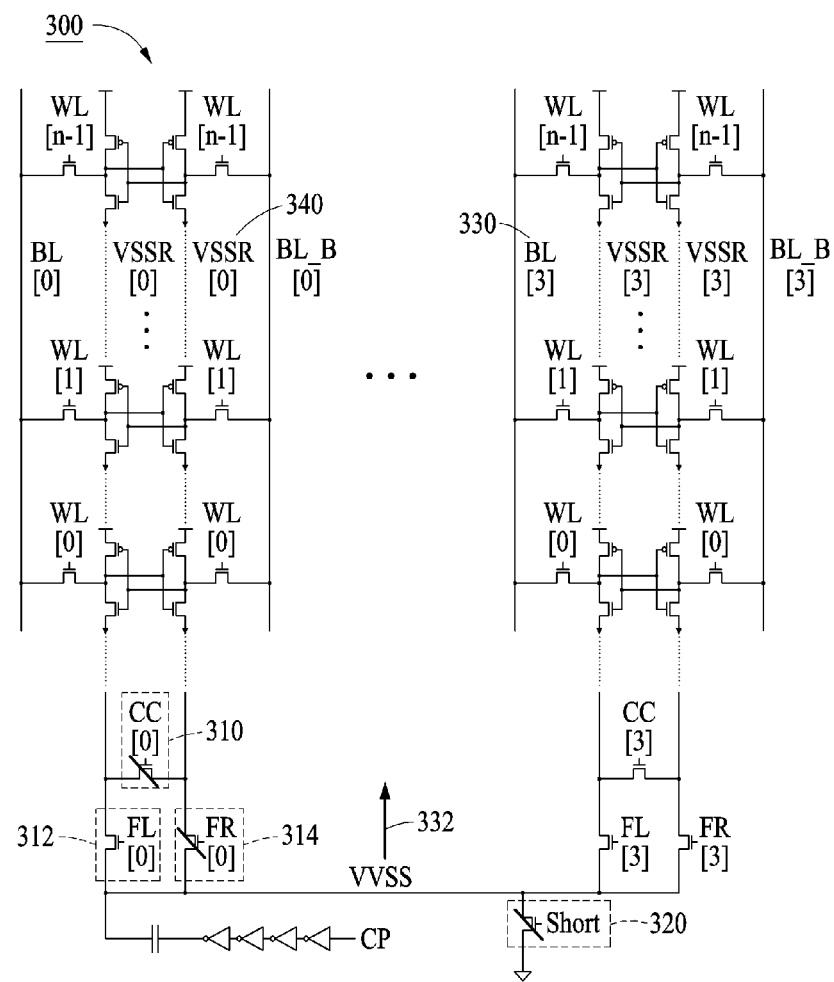
FIGS. 3A and 3B illustrate circuit configurations related to a write operation of a static random access memory according to an embodiment of the present disclosure and graphs therefor.
Figure 3B:
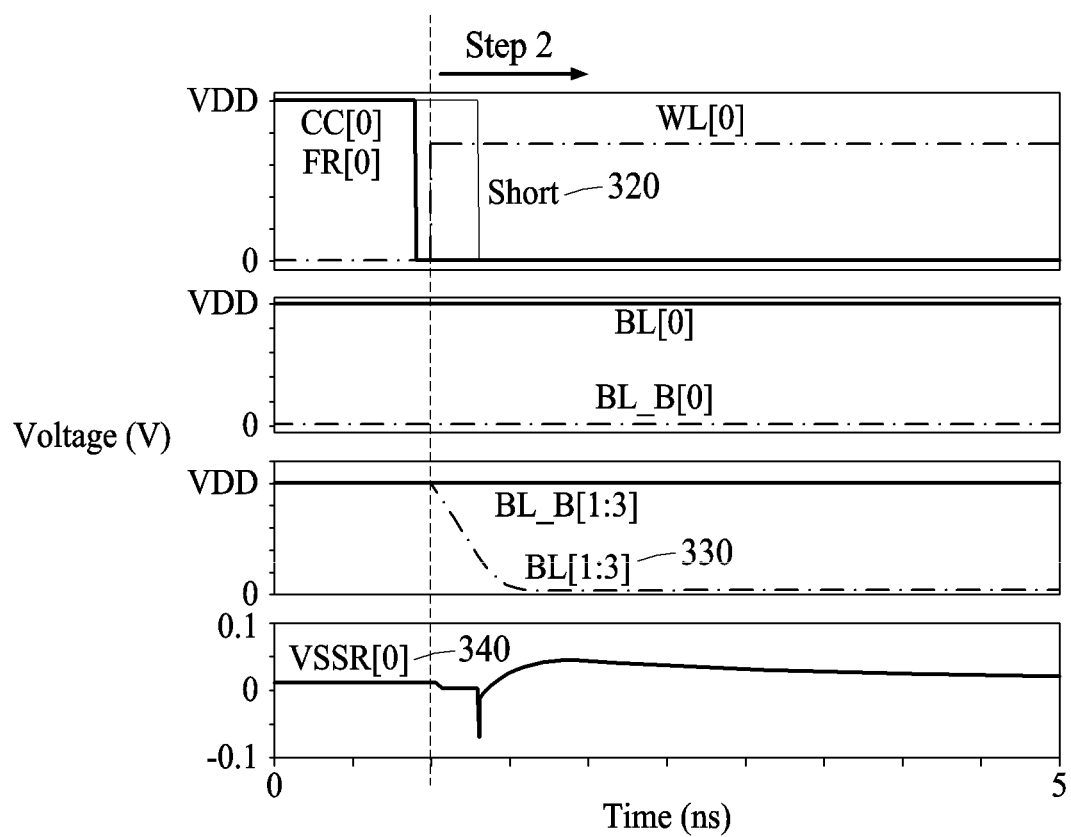

FIGS. 3A and 3B illustrate a circuit configuration related to a write operation of a static random access memory according to an embodiment of the present disclosure and graphs therefor.

In particular, FIGS. 3A and 3B illustrates components related to a second write operation step of a static random access memory according to an embodiment of the present disclosure and graphs therefor.

More particularly, a circuit configuration related to an operation wherein a controller controls a fourth transistor, after a voltage of a bit line of an adjacent bit cell part is discharged, is illustrated.

Referring to FIG. 3A, when a write operation is performed in a bit cell selected from a bit cell part in a static random access memory 300, any one cell 240 of an adjacent bit cell part located on the same row line as the bit cell selected from the bit cell part may perform a read operation.

In addition, a second ground voltage of a second ground voltage node floats based on turn-off of first and third transistors 310 and 314, and charge of a bit line or bit line bar connected to the adjacent bit cell part may be discharged.

That is, as a cell connection control transistor and a second floating transistor are turned off in the adjacent bit cell part, charge of a bit line 330 connected to the adjacent bit cell part may be discharged.

For example, the controller may float the second ground voltage of the second ground voltage node and discharge charge of the bit line 330 connected to the adjacent bit cell part when a write operation for the bit cell selected from the bit cell part is performed.

Accordingly, since an integrated ground voltage increases after a bit line or bit line bar of a unselected bit cell is discharged for a predetermined time in a write operation of the static random access memory according to an embodiment of the present disclosure, read stability of a row half-selected bit cell may be guaranteed.

In accordance with an embodiment of the present disclosure, the controller may include a fourth transistor 320 configured to block an integrated ground voltage including the first and second ground voltages transmitted to the bit cell part and a ground voltage transmitted to the adjacent bit cell part to float the integrated ground voltage.

In accordance with an embodiment of the present disclosure, the controller may float an integrated ground voltage by turning off the fourth transistor 320 after discharging a power supply voltage of a third bit line 330 or a fourth bit line connected to at least one second bit cell.

That is, the controller may increase an integrated ground voltage 332 and a second ground voltage of a second ground voltage node 340 by discharging charge of the bit line 330 connected to the adjacent bit cell part.

Accordingly, in a write operation of the static random access memory according to an embodiment of the present disclosure, charge of a bit line or bit line bar of an unselected column may be discharged after floating of an integrated ground voltage and the integrated ground voltage may increase, without additional energy consumption, depending upon the discharged charge.

That is, the static random access memory 300 may increase the integrated ground voltage 332 by providing a voltage of a bit line or bit line bar corresponding to an unselected column as the integrated ground voltage 332, and may also increase the second ground voltage of the second ground voltage node 340 based on influence of the increased integrated ground voltage 332.

FIG. 3B illustrates a voltage change in the circuit operation of FIG. 3 (*a*).

Referring to FIG. 3B, in a second write operation step, a driving voltage of the fourth transistor 320 may be converted from a high level to a low level, the charge of the bit line 330 connected to the adjacent bit cell part may be decreased, and the second ground voltage of the second ground voltage node 340 may increase.

Figure 4A:
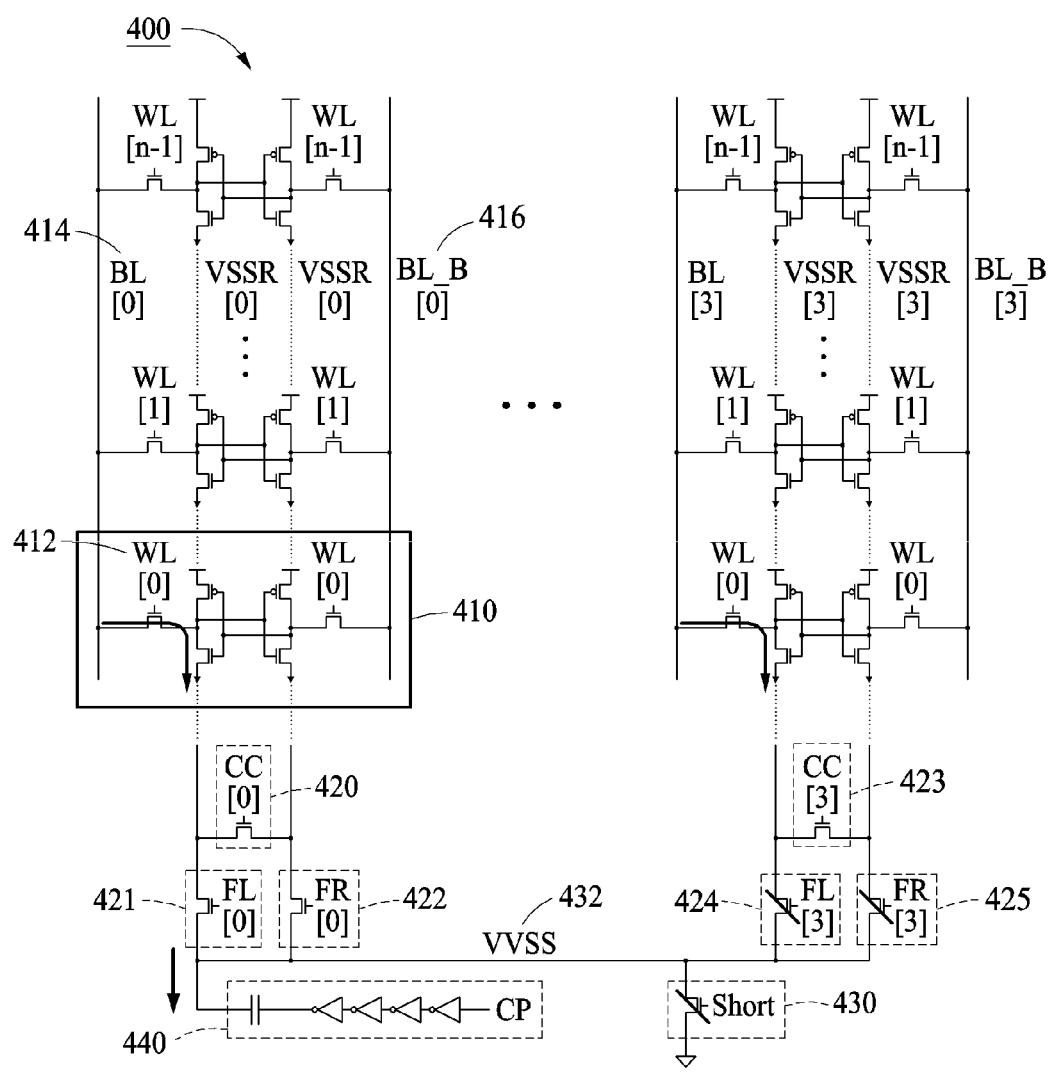
FIGS. 4A and 4B illustrate a circuit configuration related to a read operation of a static random access memory according to an embodiment of the present disclosure and a graph therefor.
Figure 4B:
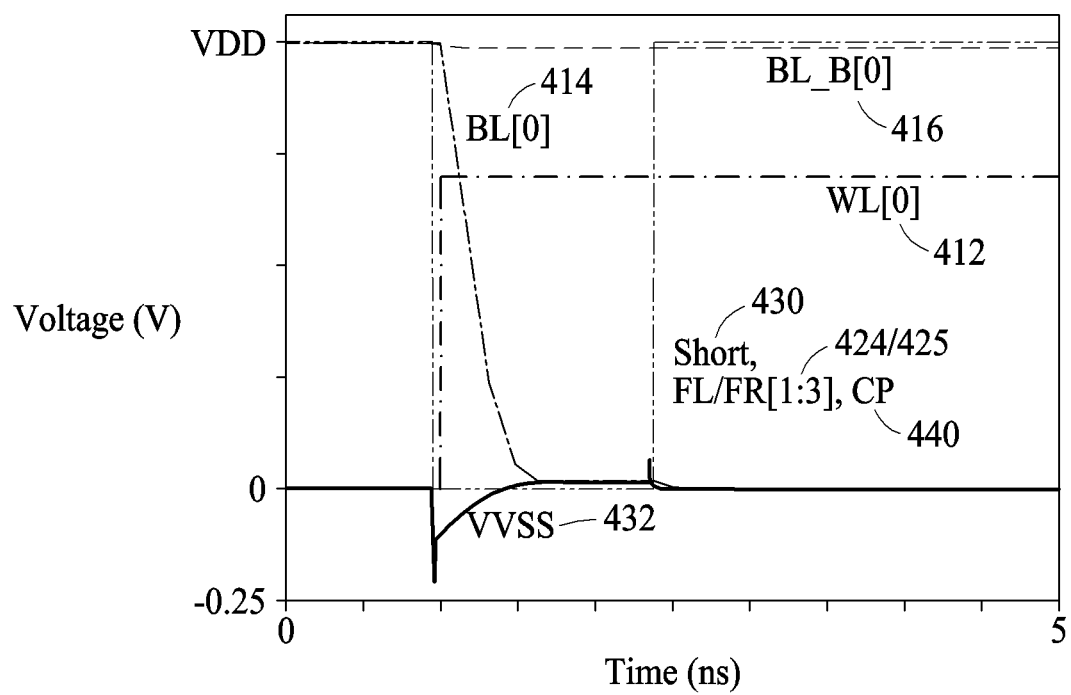

FIGS. 4A and 4B illustrate a circuit configuration related to a read operation of a static random access memory according to an embodiment of the present disclosure and a graph therefor.

In particular, FIGS. 4A and 4B illustrate components related to a read operation of a static random access memory according to an embodiment of the present disclosure and a graph therefor.

Referring to FIG. 4A, a static random access memory 400 according to an embodiment of the present disclosure may perform a read operation for a bit cell 410 selected from a first bit cell part. The selected bit cell 410 may be connected to a word line 412. A first bit cell may be located between a first ground voltage node 414 and a second ground voltage node 416.

A controller according to an embodiment of the present disclosure may convert driving voltages of sixth and seventh transistors 424 and 425 including first and second floating transistors for a row half-selected bit cell in an adjacent bit cell part located on the same row line as the selected bit cell 410 from a high level to a low level and may convert a driving voltage of a fourth transistor 430 from a high level to a low level to turn off the fourth, sixth, and seventh transistors 430, 424, and 425. That is, the controller floats an integrated ground voltage using the fourth, sixth, and seventh transistors 430, 424, and 425.

In accordance with an embodiment of the present disclosure, the static random access memory 400 may further include a circuit protector 440 configured to float an integrated ground voltage using inverter chain delay and then convert the floated integrated ground voltage to a negative voltage.

That is, the circuit protector 440 may convert the integrated ground voltage to a negative voltage using a coupling phenomenon of the integrated ground voltage. For example, the negative voltage may include a minus voltage. In accordance with an embodiment of the present disclosure, the controller may turn on a first transistor 420, a second transistor 421, a third transistor 422, and a fifth transistor 423 and turn off the fourth transistor 430, the sixth transistor 424, and the seventh transistor 425 when the circuit protector 440 converts the integrated ground voltage to a negative voltage.

In accordance with an embodiment of the present disclosure, the static random access memory 400 may convert driving voltage of the word line 412 connected to the bit cell 410, which is selected in a state in which the integrated ground voltage is a negative voltage, from a low level to a high level.

In accordance with an embodiment of the present disclosure, the static random access memory 400 may increase the strength of a pull-down transistor in the bit cell 410 by performing a read operation for the bit cell 410, which is selected in a state in which the integrated ground voltage is a negative voltage, thereby increasing a read current.

FIG. 4B illustrates a voltage change in the circuit operation of FIG. 4A.

Referring to FIG. 4B, the voltage change includes a driving voltage change in the word line 412 connected to the selected bit cell 410, voltage changes in first and second bit lines 414 and 416, driving voltage changes in the sixth and seventh transistors 424 and 425, a driving voltage change in the circuit protector 440, a driving voltage change in the fourth transistor 430, and a change in an integrated ground voltage 432 based on a time axis.

Referring to the voltage change, the static random access memory 400 according to an embodiment of the present disclosure may reduce read delay of the bit cell selected from the bit cell part, based on the effect of a read assist circuit, by lowering the integrated ground voltage to a negative voltage using a coupling phenomenon before the voltage of the word line is converted to a high level in the read operation.

Figure 5:
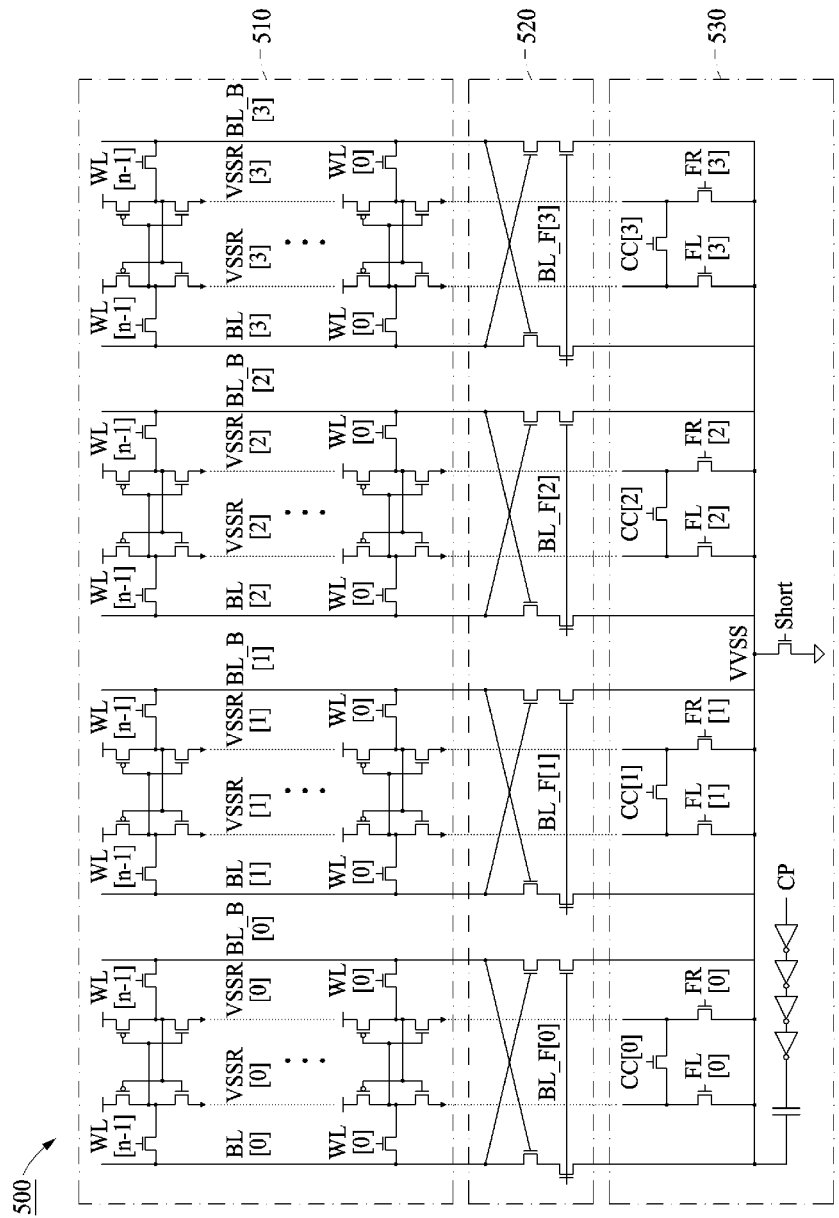
FIG. 5 illustrates a circuit configuration of a static random access memory according to another embodiment of the present disclosure.

FIG. 5 illustrates a circuit configuration of a static random access memory according to another embodiment of the present disclosure.

In particular, FIG. 5 illustrates a circuit configuration of a static random access memory including the static random access memory illustrated in FIG. 1 and a cross coupler.

Referring to FIG. 5, the static random access memory 500 may include a bit cell part 510, a cross coupler 520, and a controller 530.

In accordance with another embodiment of the present disclosure, the bit cell part 510 may include a plurality of bit cell parts and may share a driving voltage of a word line through bit cells located on the same row line.

In accordance with another embodiment of the present disclosure, the cross coupler 520 may include a plurality of cross couplers connected to each bit cell part.

For example, the cross coupler 520 may refer to a circuit that cross-couples a bit line and a bit line bar.

For example, each cross coupler may include transistors related to cross connection of first and second bit lines connected to each of the bit cell parts and transistors related to connection between the first and second bit lines and a ground voltage.

In accordance with another embodiment of the present disclosure, the controller 530 may control connection of a ground voltage by controlling transistors connected to each of the bit cell parts.

In accordance with another embodiment of the present disclosure, the bit cell part 510 may operate in the same manner as the first, second, third, and fourth bit cell parts 110, 120, 130, and 140 illustrated in FIG. 1.

In accordance with another embodiment of the present disclosure, the controller 530 may operate in the same manner as the controller 150 illustrated in FIG. 1.

In accordance with an embodiment of the present disclosure, the static random access memory 500 may include the cross coupler 520 including transistors that control voltage sharing between the bit cell part 510 and the controller 530.

In accordance with an embodiment of the present disclosure, the static random access memory 500 may include the cross coupler 520 including transistors that control voltage sharing between a first bit line and a second bit line.

Figure 6A:
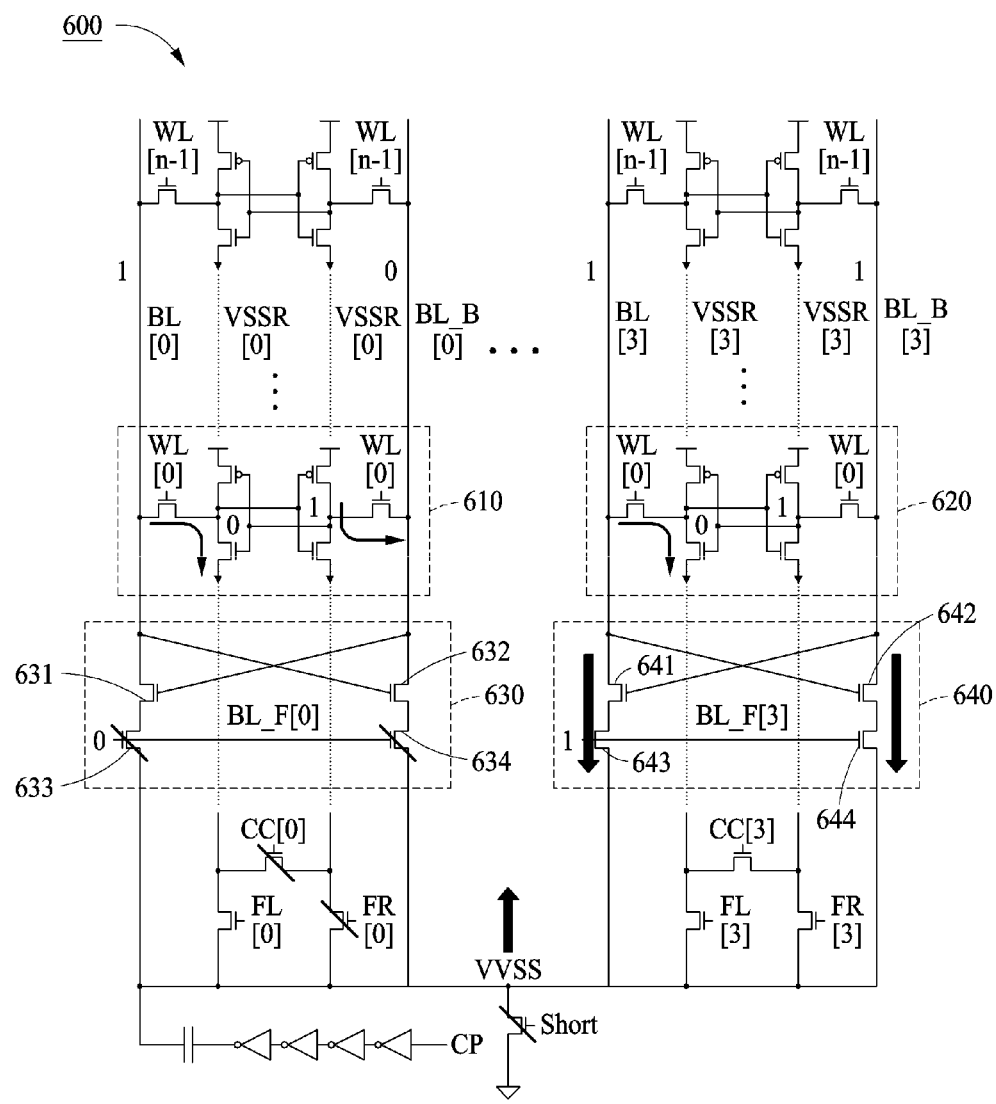
FIGS. 6A and 6B illustrate circuit configurations related to a write operation of a static random access memory according to another embodiment of the present disclosure.

FIG. 6A illustrates a circuit configuration related to a write operation of a static random access memory according to another embodiment of the present disclosure.

In particular, FIG. 6A illustrates components related to a first write operation step of a static random access memory according to another embodiment of the present disclosure.

Referring to FIG. 6A, in a static random access memory 600, a writing operation for a bit cell 610 in a bit cell part is performed. Here, a bit cell 620 located on the same row as the selected bit cell 610 may correspond to a row-half selected bit cell.

A voltage corresponding to a high level may be applied to a first bit line connected to the bit cell part, and a voltage corresponding to a low level may be applied to a second bit line connected to the bit cell part. For example, the voltage corresponding to a high level may include a drain voltage, and the voltage corresponding to a low level may include a source voltage. For example, the first bit line may include a bit line, and the second bit line may include a bit line bar.

The static random access memory 600 may separate a first ground voltage (VSSL) and a second ground voltage (VSSR) among ground voltages supplied to the bit cell part.

For example, during a writing operation for the bit cell 610, the cross coupler 630 turns off transistors controlling connection between the bit cell 610 and a controller to block connection of the first bit line and the second bit line.

That is, the cross coupler 630 turns on a transistor 631 and a transistor 632 to cross-connect voltages of the first and second bit lines and turns off and blocks a transistor 633 and a transistor 634.

Meanwhile, a cross coupler 640 connected to the bit cell 620 turns on transistors controlling connection between the bit cell 620 and a controller to connect a first bit line and a second bit line, and may discharge a voltage from the bit cell 620.

That is, the cross coupler 640 turns on a transistor 641 and a transistor 642 to cross-connect voltages of the first and second bit lines and turns on a transistor 643 and a transistor 644.

Figure 6B:
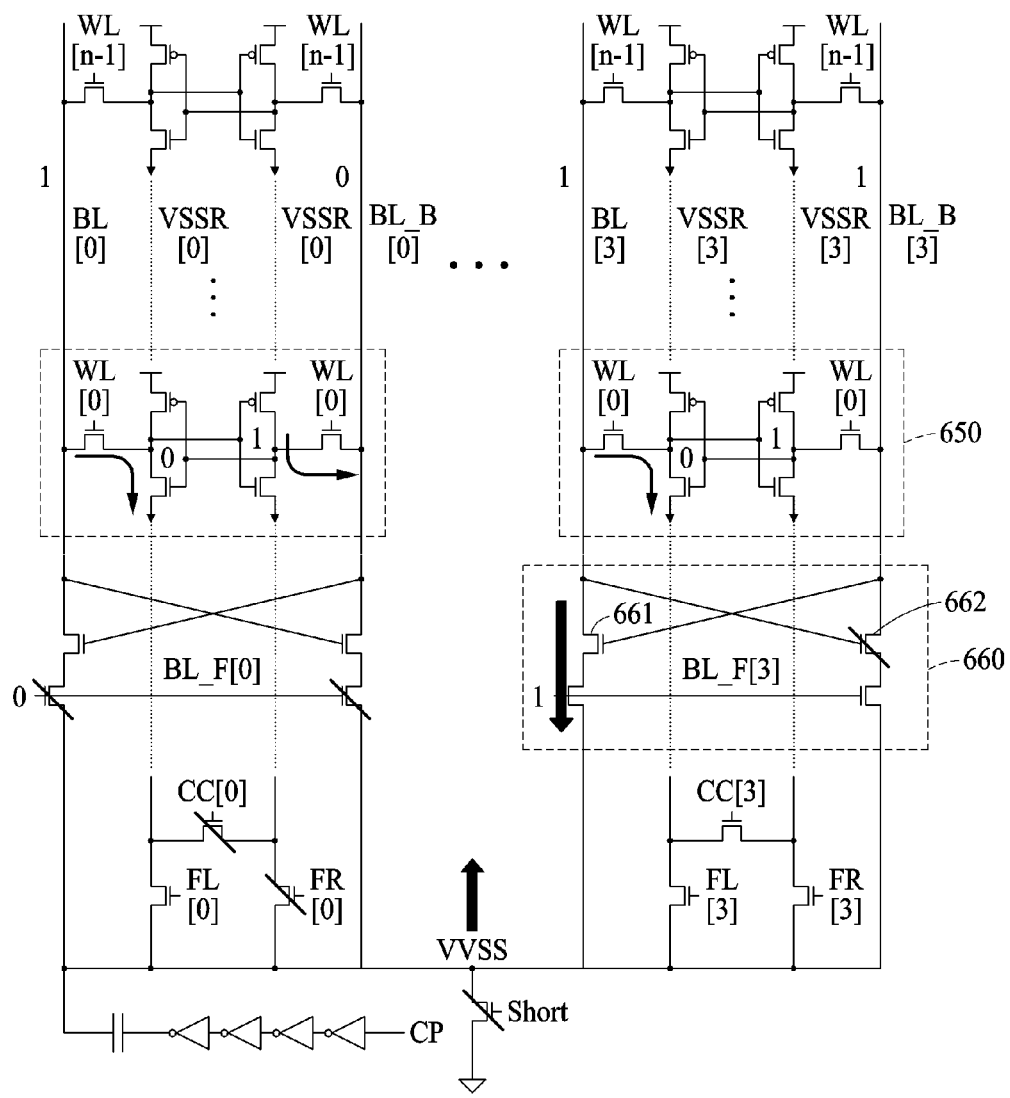

FIG. 6B illustrates a circuit configuration related to a write operation of a static random access memory according to another embodiment of the present disclosure.

In particular, FIG. 6B illustrates components related to a second write operation step of a static random access memory according to another embodiment of the present disclosure.

A cross coupler 660 according to another embodiment of the present disclosure may turn on a cross-connected transistor 661 and may turn off a cross-connected transistor 662.

That is, the static random access memory 600 senses first and second bit lines through the transistors 661 and 662 to turn off the transistor 662 connected to a storage node storing data corresponding to a high level in a bit cell 650.

In accordance with another embodiment of the present disclosure, the static random access memory 600 may turn off a transistor connected to a storage node storing data corresponding to a high level in a row-half-selected bit cell to improve writing ability of a selected cell.

In addition, in the static random access memory 600, read disturbance of the row-half-selected bit cell is decreased due to voltage reduction of first and second bit lines of the row-half-selected bit cell, thereby increasing read stability.

In accordance with an embodiment of the present disclosure, the static random access memory 600 may more rapidly increase an integrated ground voltage by controlling voltage sharing between the first bit line and the second bit line to increase writing ability of a selected cell.

Figure 7:
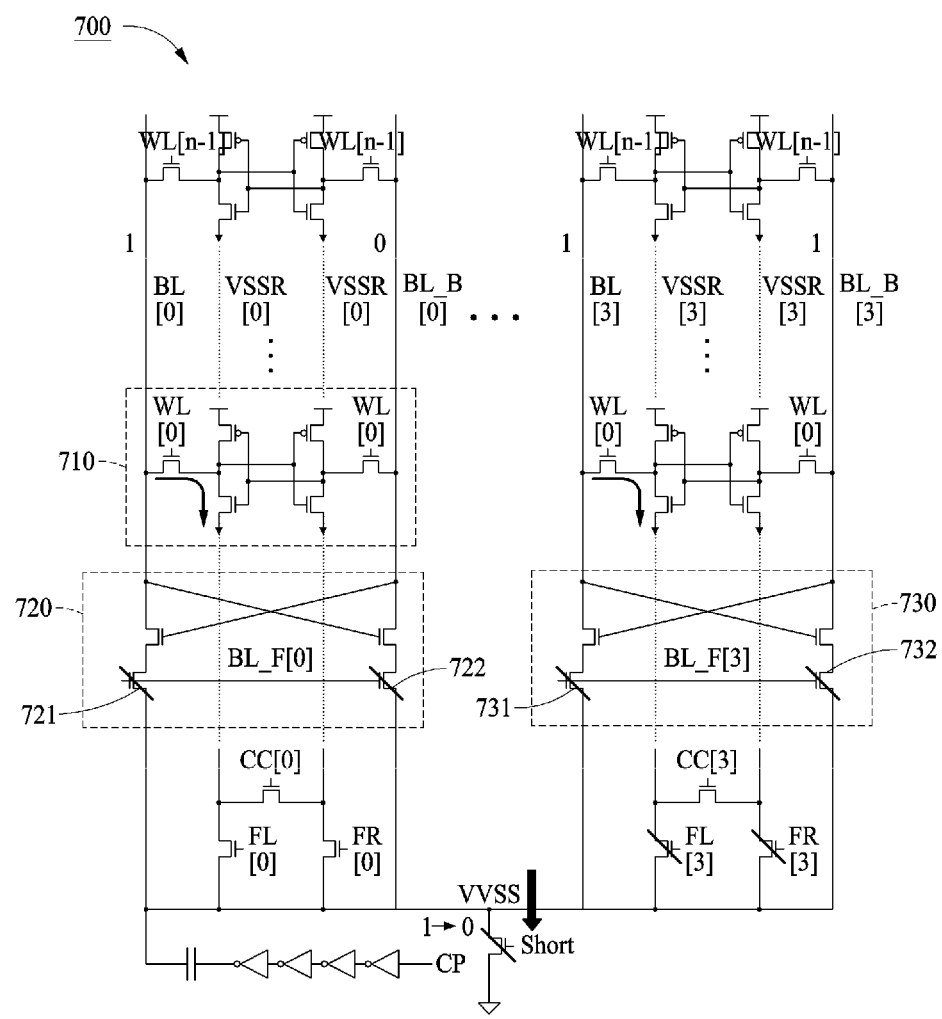
FIG. 7 illustrates a circuit configuration related to a read operation of a static random access memory according to another embodiment of the present disclosure.

FIG. 7 illustrates a circuit configuration related to a read operation of a static random access memory according to another embodiment of the present disclosure.

In particular, FIG. 7 illustrates components related to a read operation of a static random access memory according to another embodiment of the present disclosure.

Referring to FIG. 7, a static random access memory according 700 to another embodiment of the present disclosure may select a bit cell 710 to perform a read operation in the selected the bit cell 710. For example, the bit cell 710 may be located between ground voltage nodes.

The static random access memory 700 according to another embodiment of the present disclosure may convert an integrated ground voltage to a negative voltage depending upon a phenomenon that a voltage applied to a circuit protector is converted from a high level to a low level to cause coupling of an integrated ground voltage after floating an integrated ground voltage using path delay of an inverter chain between a circuit protector and a capacitor.

For example, as the static random access memory 700 performs a read operation for the selected bit cell 710 in a state in which the integrated ground voltage is a negative voltage, the strength of a pull-down transistor in the bit cell 710 may increase, thereby increasing a read current.

The static random access memory 700 according to another embodiment of the present disclosure may turn off transistors 721 and 722 of a cross coupler 720 and transistors 731 and 732 of a cross coupler 730 during a read operation for the selected bit cell 710, thereby increasing a read current in the bit cell 710.

As apparent from the above description, a static random access memory according to an embodiment of the present disclosure can increase efficiency of read and write operations by controlling a column-based ground voltage using an assist circuit.

In addition, in a write operation of the static random access memory according to an embodiment of the present disclosure, charge of a bit line or bit line bar of an unselected column can be discharged after floating of an integrated ground voltage and the integrated ground voltage can increase, without additional energy consumption, depending upon the discharged charge.

In addition, since a ground voltage of a data node for writing first data among ground voltages of a bit cell selected from a bit cell part only increases in a write operation of the static random access memory according to an embodiment of the present disclosure, the possibility of the data flip can increase, thereby increasing writing ability of the bit cell selected from the bit cell part.

In addition, since an integrated ground voltage increases after a bit line or bit line bar of a unselected bit cell is discharged for a predetermined time in a write operation of the static random access memory according to an embodiment of the present disclosure, read stability of a row half-selected bit cell can be guaranteed.

In addition, the static random access memory according to an embodiment of the present disclosure can reduce read delay of a bit cell selected from a bit cell part, based on the effect of a ground voltage control assist circuit, by lowering an integrated ground voltage to a negative voltage using a coupling phenomenon before a voltage of a word line is converted to a high level in a read operation.

In addition, a cross coupler of the static random access memory according to an embodiment of the present disclosure can turn off a transistor configured to control connection between a first bit line and a second bit line during a read operation for a selected bit cell, thereby increasing a read current in the selected bit cell.

In addition, the static random access memory according to an embodiment of the present disclosure can turn off a transistor connected to a storage node storing data corresponding to a high level in a row-half-selected bit cell, thereby improving writing ability of a selected cell.

Further, the static random access memory according to an embodiment of the present disclosure can more rapidly increase an integrated ground voltage by controlling voltage sharing between the first bit line and the second bit line, thereby increasing writing ability of a selected cell.

In the aforementioned embodiments, the components of the present disclosure have been expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural components may be a singular constituent or a singular constituent may be plural components.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

100: STATIC RANDOM ACCESS MEMORY
110: FIRST BIT CELL PART
111: FIRST GROUND VOLTAGE NODE
112: SECOND GROUND VOLTAGE NODE
113: FIRST BIT LINE
114: SECOND BIT LINE
115: WORD LINE
116: SELECTED BIT CELL
150: CONTROLLER
151: FIRST TRANSISTOR
152: SECOND TRANSISTOR
153: THIRD TRANSISTOR
154: FOURTH TRANSISTOR
160: CIRCUIT PROTECTOR
120: SECOND BIT CELL PART
130: THIRD BIT CELL PART
140: FOURTH BIT CELL PART

What is claimed is:

1. A static random access memory, comprising:
a bit cell part comprising at least one bit cell connected between a first ground voltage node and a second ground voltage node; and
a controller comprising a first transistor configured to control connection between the first ground voltage node and the second ground voltage node, a second transistor configured to float a first ground voltage of the first ground voltage node, and a third transistor configured to float a second ground voltage of the second ground voltage node, wherein the controller controls the first and second ground voltages supplied to the bit cell part using the first, second, and third transistors, and wherein the controller turns off the first transistor, turns on the second transistor, and turns off the third transistor during a write operation for a bit cell selected from the bit cell part to float the second ground voltage of the second ground voltage node.

2. The static random access memory according to claim 1, wherein the controller converts a voltage of a word line connected to the selected bit cell from a low level to a high level after floating the second ground voltage of the second ground voltage node during the write operation for the selected bit cell.

3. The static random access memory according to claim 1, wherein the controller applies a power supply voltage to a first bit line connected to the bit cell part and applies a ground voltage to a second bit line connected to the bit cell part during the write operation for the selected bit cell.

4. The static random access memory according to claim 3, wherein the controller further comprises a fourth transistor for blocking an integrated ground voltage related to the first and second ground voltages input to the bit cell part.

5. The static random access memory according to claim 4, further comprising an adjacent bit cell part comprising at least one adjacent bit cell connected between a third ground voltage node and a fourth ground voltage node.

6. The static random access memory according to claim 5, wherein the controller further comprises a fifth transistor configured to control connection between the third ground voltage node and the fourth ground voltage node, a sixth transistor configured to float a third ground voltage of the third ground voltage node, and a seventh transistor configured to float a fourth ground voltage of the fourth ground voltage node, and controls the third and fourth ground voltages supplied to the adjacent bit cell part using the fifth, sixth, and seventh transistors.

7. The static random access memory according to claim 6, wherein the controller turns off the fourth transistor to float the integrated ground voltage, after a power supply voltage of a third or fourth bit line connected to the adjacent bit cell part is discharged.

8. The static random access memory according to claim 3, further comprising a cross coupler comprising transistors configured to control voltage sharing between the bit cell part and the controller and transistors configured to control voltage sharing between the first bit line and the second bit line.

9. The static random access memory according to claim 4, further comprising a circuit protector configured to float the integrated ground voltage using inverter chain delay and then float the floated integrated ground voltage to a negative voltage.

10. The static random access memory according to claim 9, wherein the controller turns on the first, second, third, and fifth transistors and turns off the fourth, sixth, and seventh transistors when the circuit protector converts the integrated ground voltage to the negative voltage.

11. The static random access memory according to claim 9, wherein the controller converts a voltage of a word line from a low level to a high level after conversion to the negative voltage to perform a read operation for a bit cell selected from the bit cell part.

12. A method of controlling a static random access memory comprising: a bit cell part comprising at least one bit cell connected between a first ground voltage node and a second ground voltage node; and a controller comprising a first transistor configured to control connection between the first ground voltage node and the second ground voltage node, a second transistor configured to float a first ground voltage of the first ground voltage node, and a third transistor configured to float a second ground voltage of the second ground voltage node, wherein the controller controls the first and second ground voltages supplied to the bit cell part using the first, second, and third transistors, and wherein the controller turns off the first transistor, turns on the second transistor, and turns off the third transistor during a write operation for a bit cell selected from the bit cell part to float the second ground voltage of the second ground voltage node.

\* \* \* \* \*